(12) United States Patent
Igarashi et al.

(10) Patent No.: US 6,306,731 B1
(45) Date of Patent: Oct. 23, 2001

(54) SEMICONDUCTOR DEVICE AND METHOD FOR FABRICATING THE SAME

(75) Inventors: Tadashi Igarashi; Akinori Tsukuda, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/541,429

(22) Filed: Apr. 3, 2000

(30) Foreign Application Priority Data

Oct. 8, 1999 (JP) .................................................. 11-287959

(51) Int. Cl.⁷ .......................... H01L 21/46; H01L 21/78; H01L 21/301

(52) U.S. Cl. ........................................... 438/460; 438/113

(58) Field of Search ..................................... 438/421, 459, 438/460, 461, 462, 463, 584, 458, 589, 113, 114

(56) References Cited

U.S. PATENT DOCUMENTS 6,124,179 * 9/2000 Adamic, Jr. .......................... 438/309

* cited by examiner

*Primary Examiner*—David Nelms
*Assistant Examiner*—David Nhu
(74) *Attorney, Agent, or Firm*—Jones Volentine, PLLC

(57) ABSTRACT

In a method, first and second circuit elements are provided on a surface of a semiconductor substrate; and a hole is formed in the semiconductor substrate between the first and second circuit elements. Then, the semiconductor substrate is divided at the hole to separate the first and second circuit elements from each other.

24 Claims, 18 Drawing Sheets

US 6,306,731 B1

SEMICONDUCTOR DEVICE AND METHOD FOR FABRICATING THE SAME

CROSS REFERENCE TO RELATED APPLICATION

This application claims the priority of Application No. H11-287959, filed Oct. 8, 1999 in Japan, the subject matter of which is incorporated herein by reference.

TECHNICAL FIELD OF THE INVENTION

The present invention relates to a semiconductor device and a method for fabricating the same, in which electrical connection is carried out with a via-hole.

BACKGROUND OF THE INVENTION

In a conventional method for fabricating a semiconductor device, circuit elements are formed on a semiconductor substrate. The circuit elements are electrically connected to a lead frame through a conductive layer, provided in a via-hole of the semiconductor substrate. Therefore, no wire-bonding process is required.

However, the semiconductor substrate is divided along a dicing line, which is positioned between the next two via-holes, so that a hole is left on each individual semiconductor device. As a result, it is difficult to distribute a larger area for the circuit elements, and it is difficult to increase the degree of integration of semiconductor devices.

OBJECTS OF THE INVENTION

Accordingly, an object of the present invention is to provide a method for fabricating a semiconductor device, in which the degree of integration of circuit elements is improved.

Another object of the present invention is to provide a semiconductor device, in which the degree of integration of circuit elements is improved.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, a method includes the steps of providing a semiconductor substrate; providing first and second circuit elements on a surface of the semiconductor substrate; and forming a hole in the semiconductor substrate between the first and second circuit elements. The method also includes the step of dividing the semiconductor substrate at the hole to separate the first and second circuit elements from each other.

The semiconductor device is divided along a dicing line that is overlapped with the hole, so that a wider area can be provided for the circuit elements on the semiconductor substrate.

DETAILED DISCLOSURE OF THE INVENTION

For better understanding of the present invention, a conventional technology is first described. FIGS. 1A, 2A, 3A, 4A, 5A, 6A and 7A are cross-sectional views, respectively taken on line A–A' in FIGS. 1B, 2B, 3B, 4B, 5B, 6B and 7B. FIGS. 1B, 2B, 3B, 4B, 5B, 6B and 7B are top views showing processes for fabricating a conventional semiconductor device.

Figure 1A:
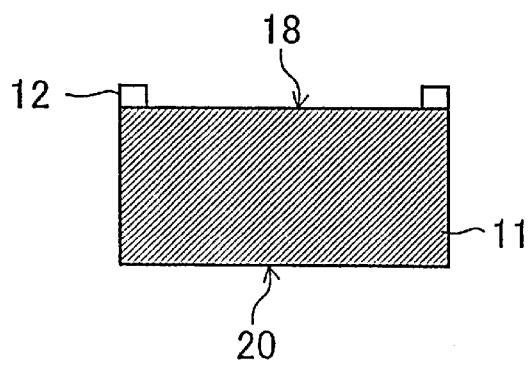
FIGS. 1A, 2A, 3A, 4A, 5A, 6A and 7A are cross-sectional views, respectively taken on line A–A' in FIGS. 1B, 2B, 3B, 4B, 5B, 6B and 7B.
Figure 1B:
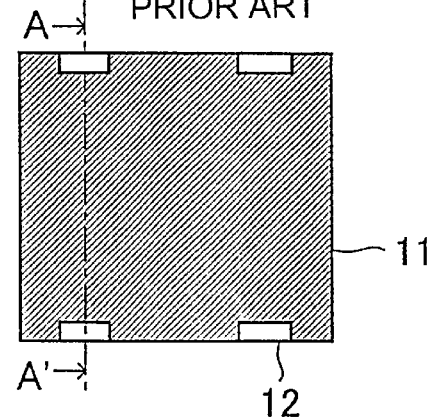
FIGS. 1B, 2B, 3B, 4B, 5B, 6B and 7B are top views showing processes for fabricating a conventional semiconductor device.

As shown in FIGS. 1A and 1B, circuit elements 12 are formed on an upper surface 18 of a semiconductor substrate 11. The circuit elements 12 are arranged so that a pair of them are opposing/facing to each other. The semiconductor substrate 11 is provided with a behind surface 20, on which no circuit element is formed.

Figure 2A:
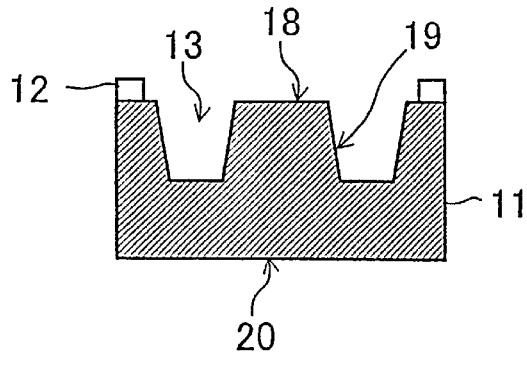
Figure 2B:
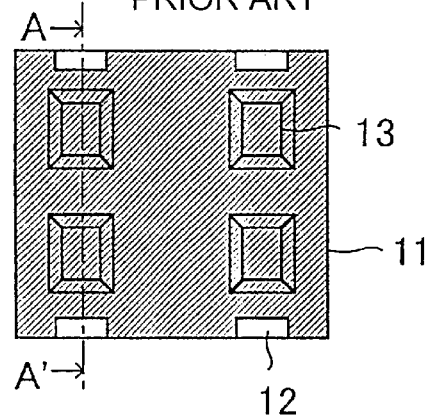
Figure 3A:
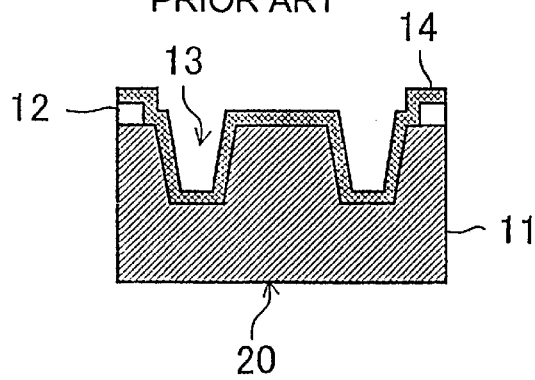
Figure 3B:
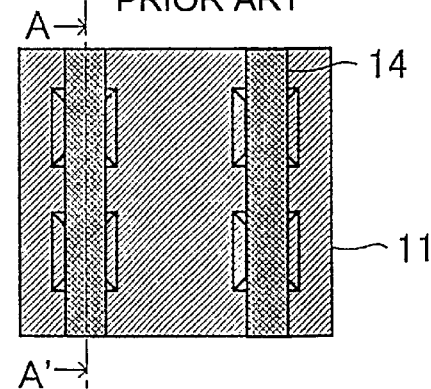

Next, as shown in FIGS. 2A and 2B, two pairs of square holes 13 are formed on the upper surface 18 of the semiconductor substrate 11. Each pair of the holes 13 is arranged between the opposing two circuit elements 12. The holes 13 do not passes through the semiconductor substrate 11. Then, as shown in FIGS. 3A and 3B, first conductive layers 14 are formed on the inside surface of the holes 13. The first conductive layers 14 are provided to extend to the opposing two circuit elements 12 so that those circuit elements 12 are electrically connected to each other.

Figure 4A:
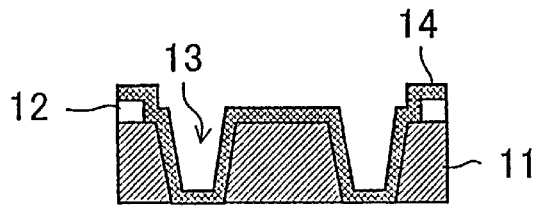
Figure 4B:
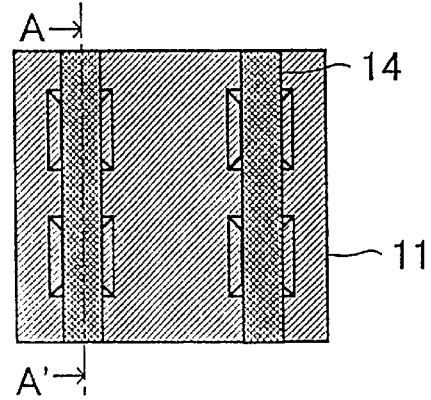
Figure 5A:
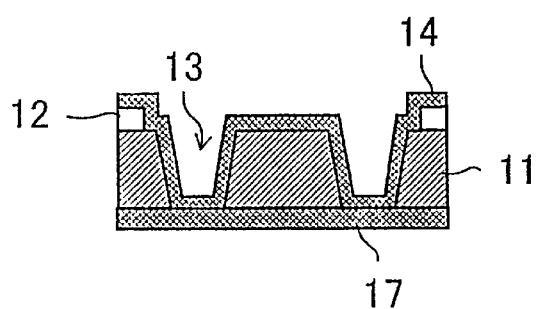
Figure 5B:
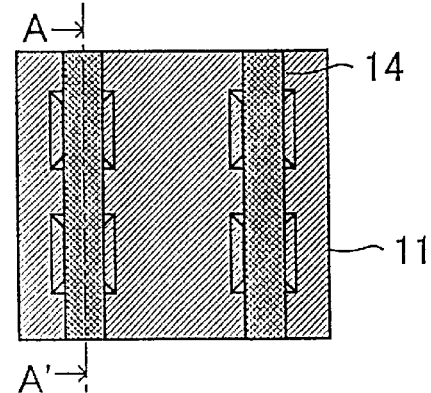

Subsequently, as shown in FIGS. 4A and 4B, the semiconductor substrate 11 is removed at the behind surface 20 by a polishing process until the first conductive layers 14 are exposed. Then, as shown in FIGS. 5A and 5B, a second conductive layer 17 is provided at the behind surface of the semiconductor substrate 11 so that the first and second conductive layers 14 and 17 are electrically connected to each other.

Figure 6A:
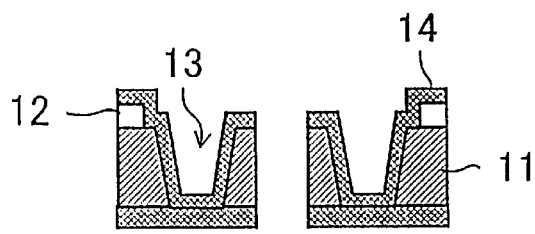
Figure 6B:
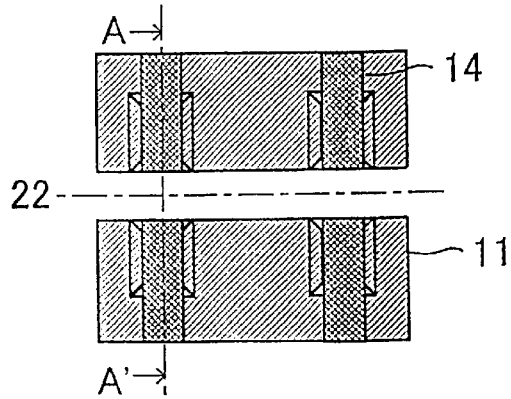
Figure 7A:
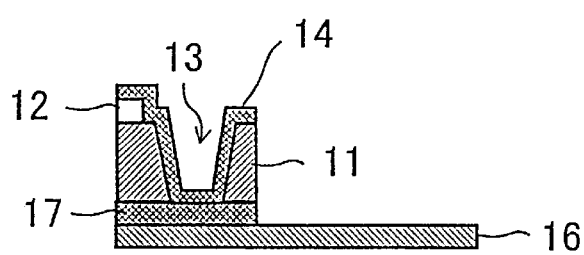
Figure 7B:
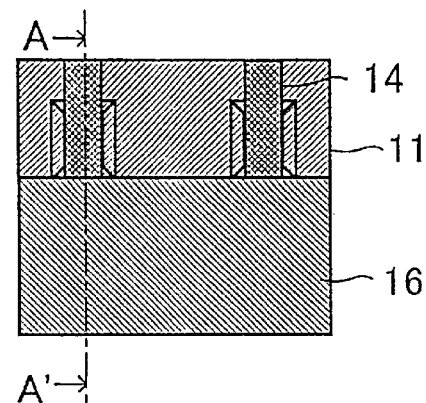

Next, as shown in FIGS. 6A and 6B, the semiconductor substrate 11 is cut/divided along a dicing line 22 to separate the opposing two circuit elements 12 from each other. Then, as shown in FIGS. 7A and 7B, the second conductive layer 17 of the divided semiconductor substrate 11 is connected to a lead frame 16 so that the circuit elements 12 are electrically connected to the lead frame 16 through the first and second conductive layers 14 and 17.

According to the conventional method for fabricating a semiconductor device, the circuit elements 12 are electrically connected to the lead frame 16 through the first and second conductive layers 14 and 17; therefore, no wire-bonding process is required.

However, the semiconductor substrate 11 is divided along the dicing line 22, which is positioned between the next two via-holes 13, so that the hole 13 is left on each individual semiconductor device. As a result, it is difficult to make an area for the circuit elements 12 larger, and it is difficult to increase the degree of integration of semiconductor devices.

Next, first to sixth preferred embodiment of the present invention would be described.

(1) First Preferred Embodiment

FIGS. 8A, 9A, 10A, 11A, 12A, 13A and 14A are cross-sectional views, respectively taken on line A–A' in FIGS. 8B, 9B, 10B, 11B, 12B, 13B and 14B. FIGS. 8B, 9B, 10B, 11B, 12B, 13B and 14B are top views showing processes for fabricating a semiconductor device according to a first preferred embodiment of the present invention.

Figure 8A:
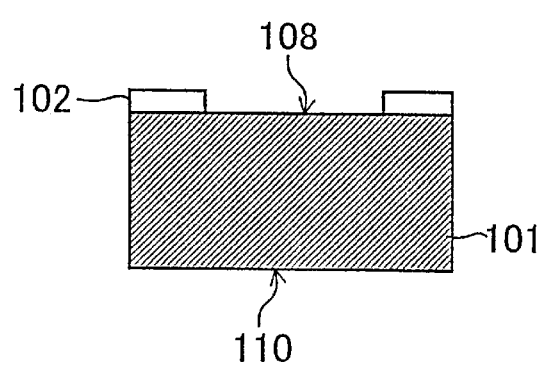
FIGS. 8A, 9A, 10A, 11A, 12A, 13A and 14A are cross-sectional views, respectively taken on line A–A' in FIGS. 8B, 9B, 10B, 11B, 12B, 13B and 14B.
Figure 8B:
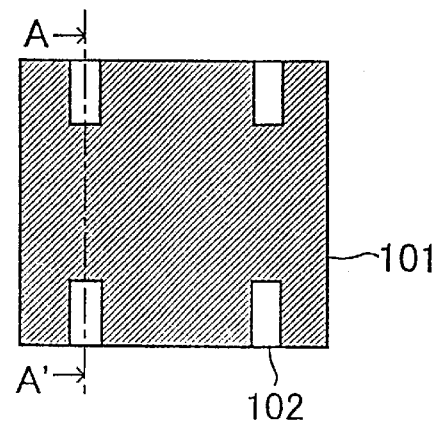
FIGS. 8B, 9B, 10B, 11B, 12B, 13B and 14B are top views showing processes for fabricating a semiconductor device according to a first preferred embodiment of the present invention.

As shown in FIGS. 8A and 8B, circuit elements 102 are formed on an upper surface 108 of a semiconductor substrate 101, which may be of GaAs (gallium arsenide). The circuit elements 102 are arranged so that a pair of them are opposing/facing to each other. In FIGS. 8A and 8B, although only four circuit elements 102 are shown, more circuit elements may be formed on the semiconductor substrate 101. The semiconductor substrate 101 is provided with a behind surface 110, on which no circuit element is formed.

Figure 9A:
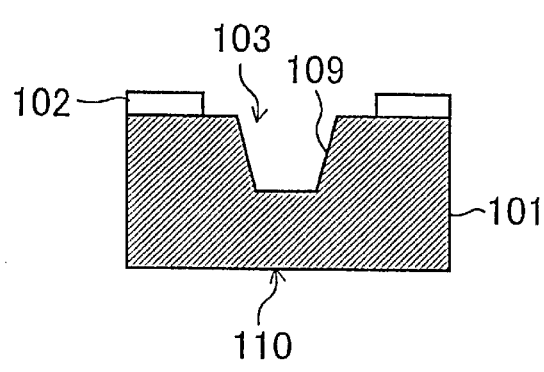
Figure 9B:
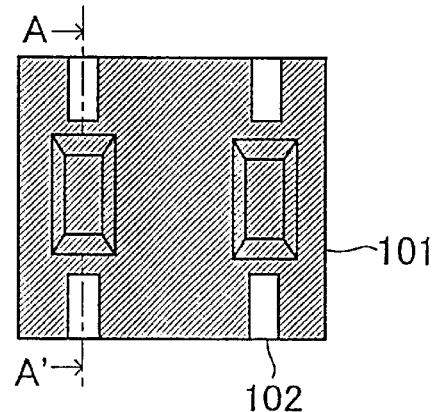

Next, as shown in FIGS. 9A and 9B, square shaped holes 103 are formed on the upper surface 108 of the semiconductor substrate 101 by an isotropic etching process. Each of the holes 103 is arranged between the opposing two circuit elements 102. In this embodiment, although the holes 103 do not passes through the semiconductor substrate 101 to the behind surface 110, the holes 103 may be passing through it.

Figure 10A:
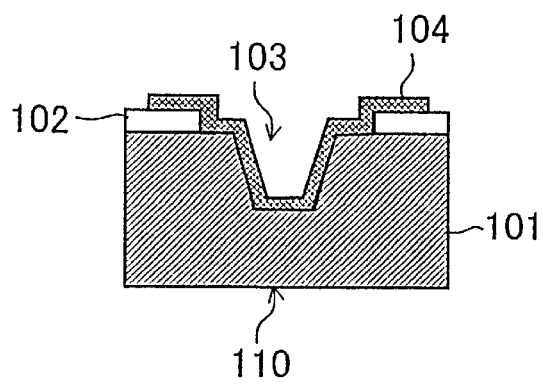
Figure 10B:
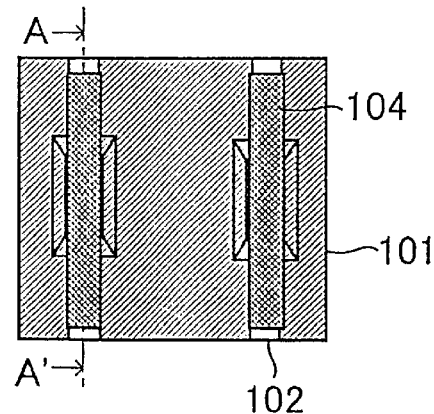

Then, as shown in FIGS. 10A and 10B, first conductive layers 104 are formed on an inside surface 109 of the holes 103. The first conductive layers 104 are provided to extend between the opposing two circuit elements 102 so that those circuit elements 102 are electrically connected to each other. The first conductive layers 104 may be of Al (aluminum) or Au (gold).

Figure 11A:
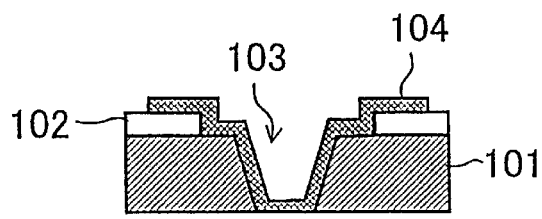
Figure 11B:
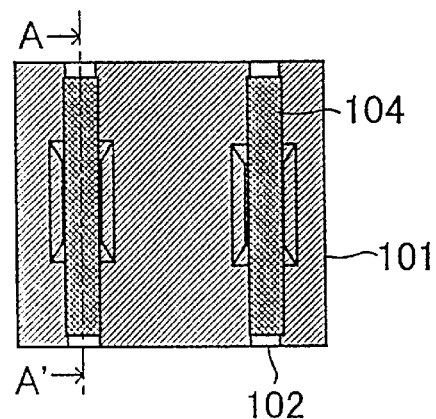
Figure 12A:
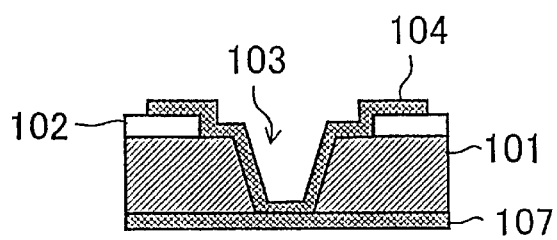
Figure 12B:
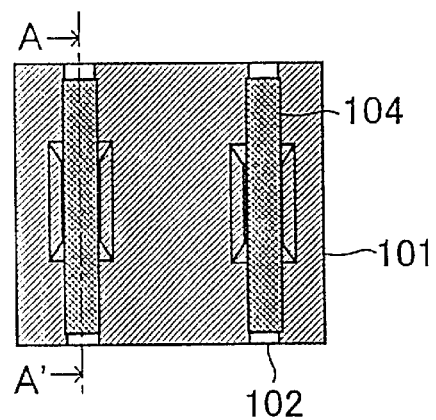

Subsequently, as shown in FIGS. 11A and 11B, the semiconductor substrate 101 is removed at the behind surface 110 until the first conductive layers 104 are exposed. The semiconductor substrate 101 may be polished using Al$_2$O$_3$ of abrasive. Then, as shown in FIGS. 12A and 12B, a second conductive layer 107 is provided at the behind surface of the semiconductor substrate 101 so that the first and second conductive layers 104 and 107 are electrically connected to each other. The second conductive layer 107 may be of Ti (titanium), Pt (platinum) or Au (gold).

Figure 13A:
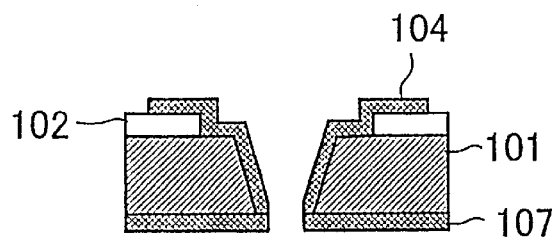
Figure 13B:
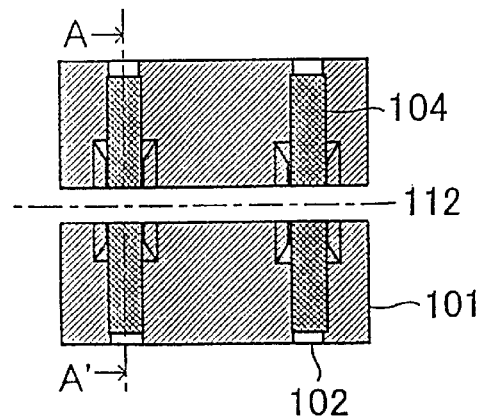
Figure 14A:
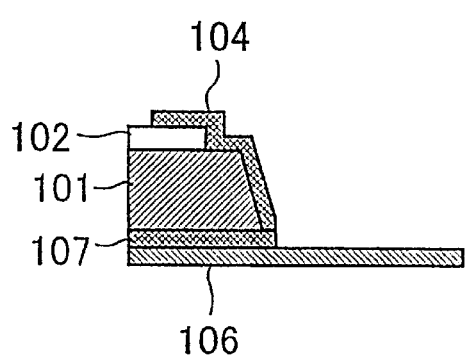
Figure 14B:
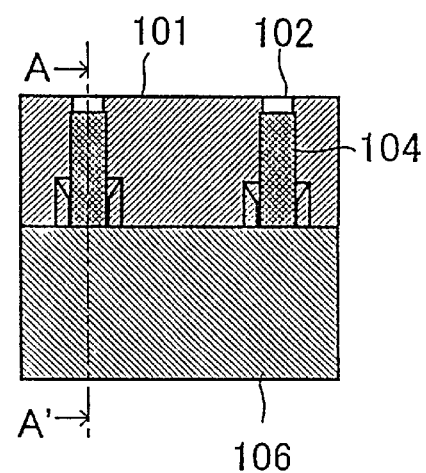

Next, as shown in FIGS. 13A and 13B, the semiconductor substrate 101 is cut/divided along a dicing line 112 to separate the opposing two circuit elements 102 from each other. Then, as shown in FIGS. 14A and 14B, the second conductive layer 107 of the divided semiconductor substrate 101 is connected/adhered to a lead frame 106 so that the circuit element 102 of each individual device is electrically connected to the lead frame 106 through the first and second conductive layers 104 and 107.

According to the first preferred embodiment of the present invention, the circuit element 102 of each semiconductor device is electrically connected to the lead frame 106 through the first and second conductive layers 104 and 107; therefore, no wire-bonding process is required.

Further, the semiconductor substrate 101 is divided along the dicing line 112, which is running across the via-hole 103, so that no hole is left on each individual semiconductor device. As a result, an area for the circuit elements 102 can be designed to be larger, and it becomes easier to increase the degree of integration of the semiconductor device.

(2) Second Preferred Embodiment

FIGS. 15A, 16A, 17A, 18A and 19A are cross-sectional views, respectively taken on line A–A' in FIGS. 15B, 16B, 17B, 18B and 19B. FIGS. 15B, 16B, 17B, 18B and 19B are top views showing processes for fabricating a semiconductor device according to a second preferred embodiment of the present invention.

Figure 15A:
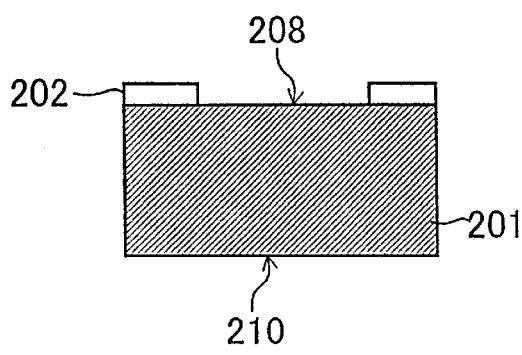
FIGS. 15A, 16A, 17A, 18A and 19A are cross-sectional views, respectively taken on line A–A' in FIGS. 15B, 16B, 17B, 18B and 19B.
Figure 15B:
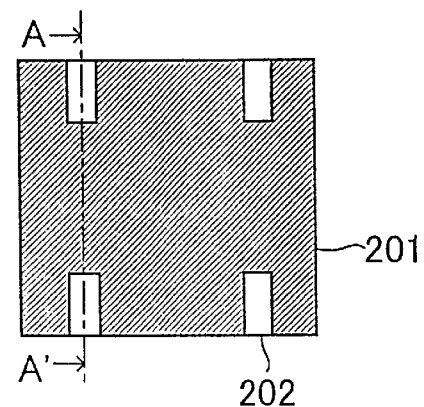
FIGS. 15B, 16B, 17B, 18B and 19B are top views showing processes for fabricating a semiconductor device according to a second preferred embodiment of the present invention.

As shown in FIGS. 15A and 15B, circuit elements 202 are formed on an upper surface 208 of a semiconductor substrate 201, which may be of GaAs (gallium arsenide). The circuit elements 202 are arranged so that a pair of them are opposing/facing to each other. In FIGS. 15A and 15B, although only four circuit elements 202 are shown, more circuit elements may be formed on the semiconductor substrate 201. The semiconductor substrate 201 is provided with a behind surface 210, on which no circuit element is formed.

Figure 16A:
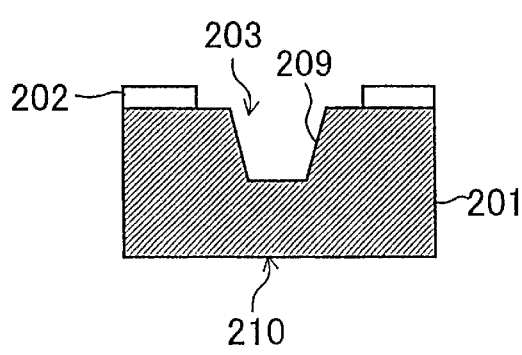
Figure 16B:
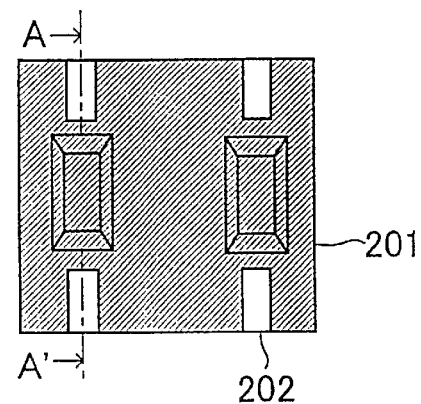

Next, as shown in FIGS. 16A and 16B, square shaped holes 203 are formed on the upper surface 208 of the semiconductor substrate 201 by an isotropic etching process. Each of the holes 203 is arranged between the opposing two circuit elements 202.

Figure 17A:
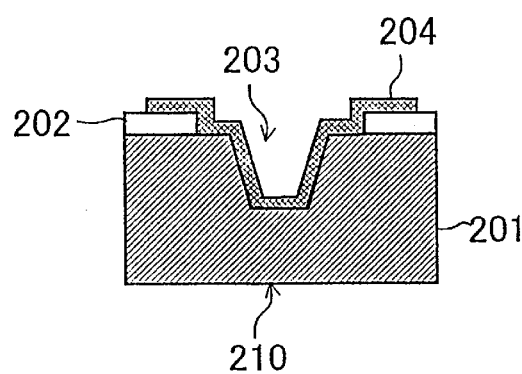
Figure 17B:
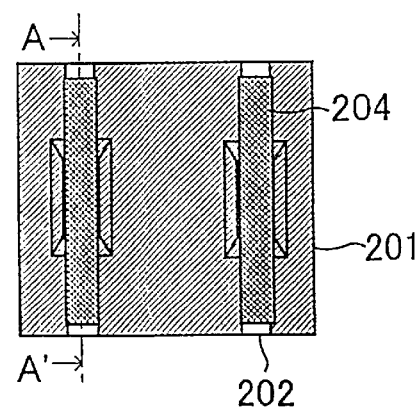

Then, as shown in FIGS. 17A and 17B, first conductive layers 204 are formed on an inside surface 209 of the holes 203. The first conductive layers 204 are provided to extend to the opposing two circuit elements 202 so that those circuit elements 202 are electrically connected to each other. The first conductive layers 204 may be of Al (aluminum) or Au (gold).

Figure 18A:
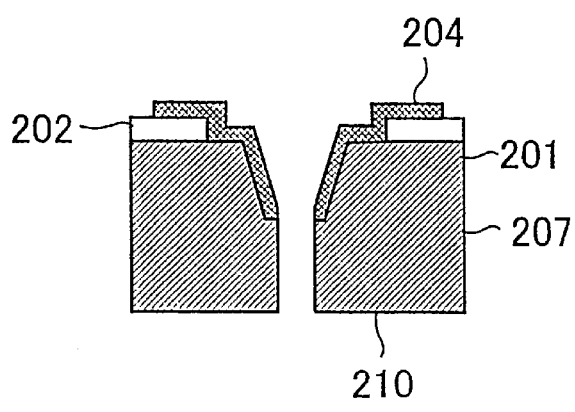
Figure 18B:
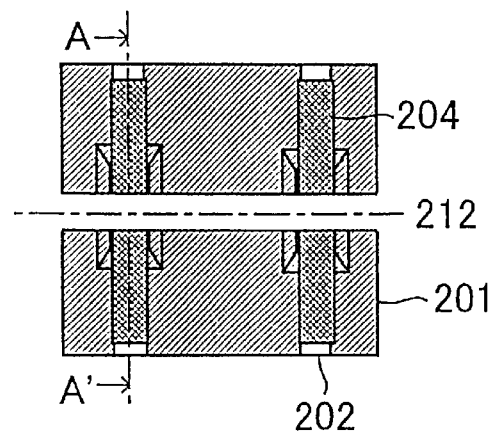

Subsequently, as shown in FIGS. 18A and 18B, the semiconductor substrate 201 is cut/divided along a dicing line 212 to separate the opposing two circuit elements 202 from each other.

Figure 19A:
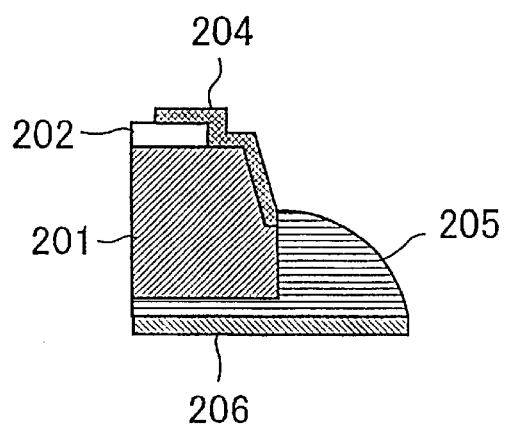
Figure 19B:
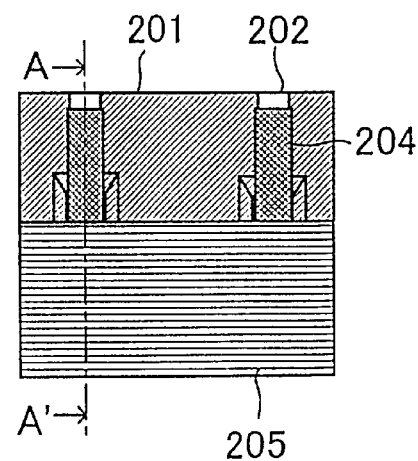

Next, a conductive adhesive 205 is spread over a lead frame 206 to have an enough thickness. The conductive adhesive 205 may be an Ag (Silver) paste. Then, as shown in FIGS. 19A and 19B, the semiconductor substrate 201 is put at the behind surface 210 onto the conductive adhesive 205. When the divided semiconductor substrate 201 is pressed onto the lead frame 206, the conductive adhesive 205 rises up. As a result, the circuit element 202 of each individual device is electrically connected to the lead frame 206 through the first conductive layer 204 and conductive adhesive 205.

According to the second preferred embodiment of the present invention, the circuit element 202 of each semiconductor device is electrically connected to the lead frame 206 through the first conductive layer 204 and conductive adhesive 205; therefore, no wire-bonding process is required. Further, the semiconductor substrate 201 is divided along the dicing line 212, which is running across the via-hole 203, so that no hole is left on each individual semiconductor device. As a result, an area for the circuit elements 202 can be designed to be larger, and it becomes easier to increase the degree of integration of the semiconductor device.

In addition, the semiconductor substrate 201 is not polished or removed at the behind surface 210, so that the semiconductor substrate 201 has an enough thickness when being cut. Therefore, the semiconductor substrate 201 is not broken easily when it is divided. If it is required to design the semiconductor device to be thinner, the semiconductor substrate 201 may be polished or removed at the behind surface 210 as long as the semiconductor substrate 201 has an enough thickness to prevent break.

(3) Third Preferred Embodiment

FIGS. 20A, 21A, 22A, 23A, 24A and 25A are cross-sectional views, respectively taken on line A–A' in FIGS. 20B, 21B, 22B, 23B, 24B and 25B. FIGS. 20B, 21B, 22B, 23B, 24B and 25B are top views showing processes for fabricating a semiconductor device according to a third preferred embodiment of the present invention.

Figure 20A:
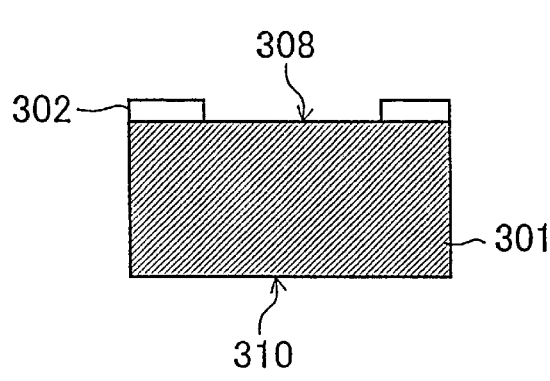
FIGS. 20A, 21A, 22A, 23A, 24A and 25A are cross-sectional views, respectively taken on line A–A' in FIGS. 20B, 21B, 22B, 23B, 24B and 25B.
Figure 20B:
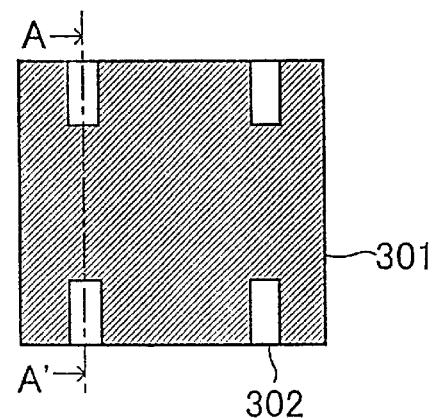
FIGS. 20B, 21B, 22B, 23B, 24B and 25B are top views showing processes for fabricating a semiconductor device according to a third preferred embodiment of the present invention.

As shown in FIGS. 20A and 20B, circuit elements 302 are formed on an upper surface 308 of a semiconductor substrate 301, which may be of GaAs (gallium arsenide). The circuit elements 302 are arranged so that a pair of them are opposing/facing to each other on the semiconductor substrate 301. In FIGS. 20A and 20B, although only four circuit elements 302 are shown, more circuit elements may be formed on the semiconductor substrate 301. The semiconductor substrate 301 is provided with a behind surface 310, on which no circuit element is formed.

Figure 21A:
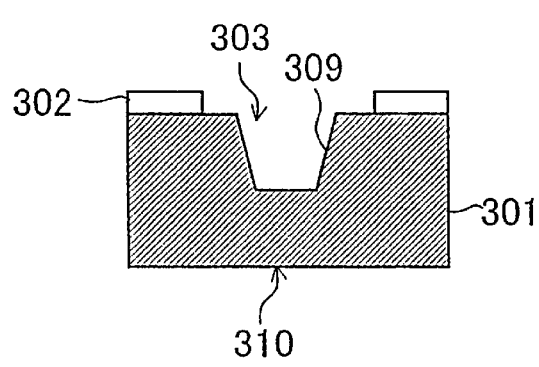
Figure 21B:
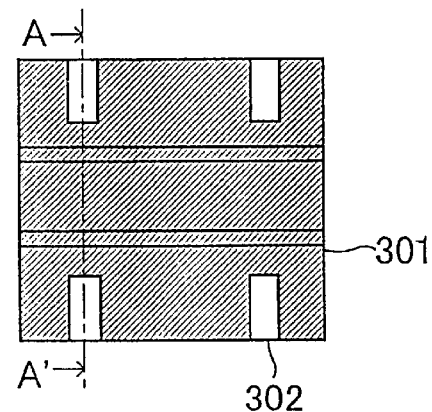

Next, as shown in FIGS. 21A and 21B, a square shaped hole 303 is formed on the upper surface 308 of the semiconductor substrate 301 by an isotropic etching process. The hole 303 is arranged between the opposing two circuit elements 302 to extend one end to the other end on the semiconductor substrate 301.

Figure 22A:
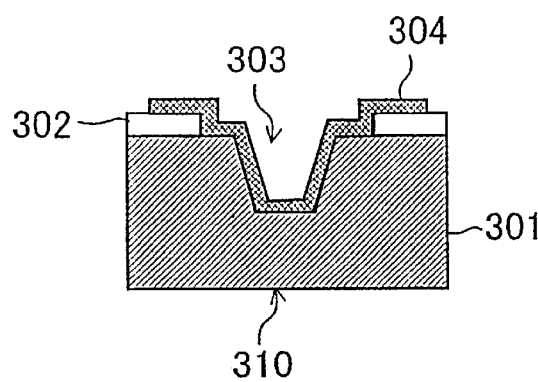
Figure 22B:
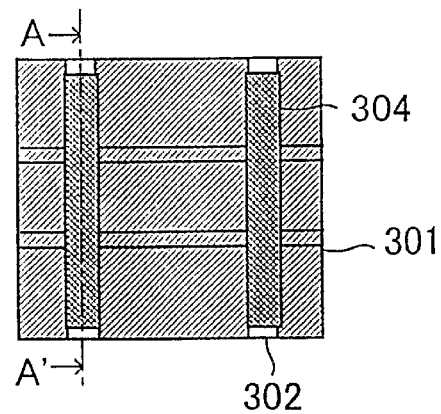

Then, as shown in FIGS. 22A and 22B, first conductive layers 304 are formed on an inside surface 309 of the hole 303. The first conductive layers 304 are provided to extend between the opposing two circuit elements 302 so that those circuit elements 302 are electrically connected to each other. The first conductive layers 304 may be of Al (aluminum) or Au (gold).

Figure 23A:
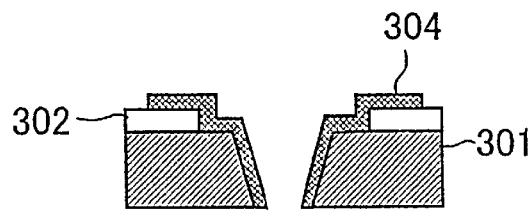
Figure 23B:
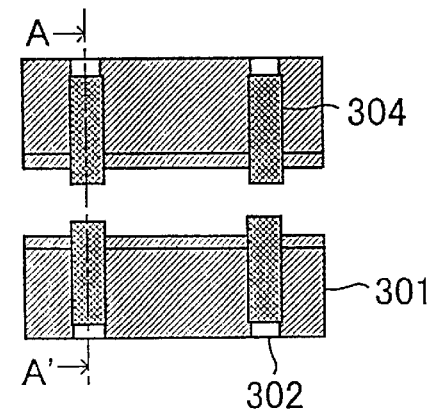

Subsequently, as shown in FIGS. 23A and 23B, the semiconductor substrate 301 is removed at the behind surface 310 until the first conductive layers 304 are exposed and the hole 303 passes through the semiconductor substrate 301. The semiconductor substrate 301 may be polished using $Al_2O_3$ of abrasive. When the hole 303 passes through the semiconductor substrate 301, the opposing two circuit elements 302 are separated from each other.

Figure 24A:
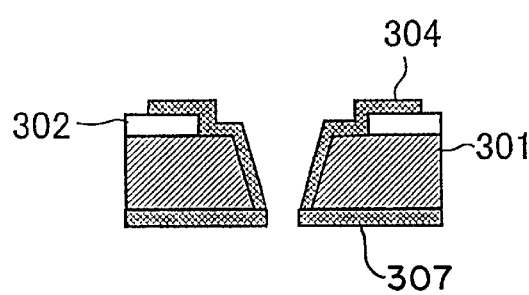
Figure 24B:
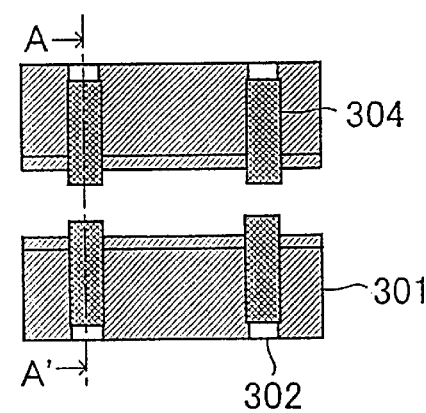

Then, as shown in FIGS. 24A and 24B, second conductive layers 307 are provided at the behind surface of the semiconductor substrate 301 so that the first and second conductive layers 304 and 307 are electrically connected to each other. The second conductive layer 307 may be of Ti (titanium), Pt (platinum) or Au (gold).

Figure 25A:
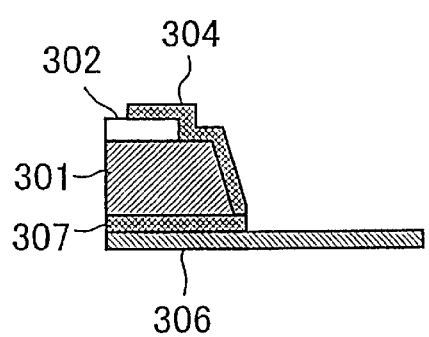
Figure 25B:
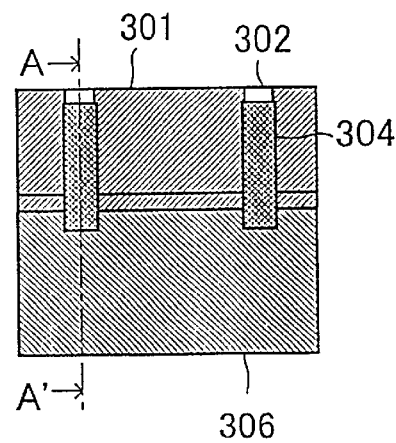

Next, as shown in FIGS. 25A and 25B, the second conductive layer 307 of the divided semiconductor substrate 301 is connected/adhered to a lead frame 306 so that the circuit element 302 of each individual device is electrically connected to the lead frame 306 through the first and second conductive layers 304 and 307.

According to the third preferred embodiment of the present invention, the circuit element 302 of each semiconductor device is electrically connected to the lead frame 306 through the first and second conductive layers 304 and 307; therefore, no wire-bonding process is required. Further, the semiconductor substrate 301 is divided along the hole 303, so that no hole is left on each individual semiconductor device. As a result, an area for the circuit elements 302 can be designed to be larger, and it becomes easier to increase the degree of integration of the semiconductor device.

In addition, according to the third preferred embodiment, the semiconductor substrate 301 is divided by polishing the behind surface thereof, so that cutting process can be omitted. In other words, the fabricating process can be simplified.

(4) Fourth Preferred Embodiment

FIGS. 26A, 27A, 28A, 29A, 30A, 31A and 32A are cross-sectional views, respectively taken on line A–A' in FIGS. 26B, 27B, 28B, 29B, 30B, 31B and 32B. FIGS. 26B, 27B, 28B, 29B, 30B, 31B and 32B are top views showing processes for fabricating a semiconductor device according to a fourth preferred embodiment of the present invention.

Figure 26A:
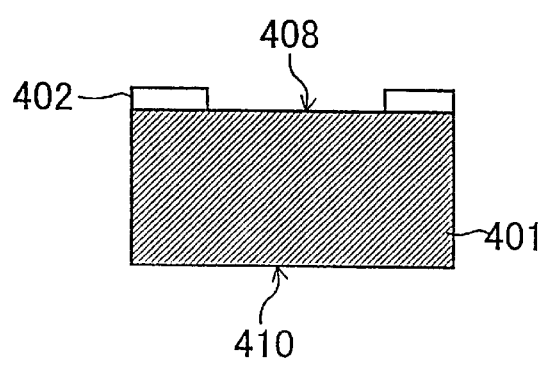
FIGS. 26A, 27A, 28A, 29A, 30A, 31A and 32A are cross-sectional views, respectively taken on line A–A' in FIGS. 26B, 27B, 28B, 29B, 30B, 31B and 32B.
Figure 26B:
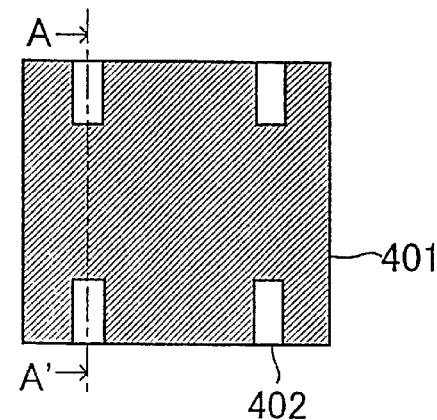
FIGS. 26B, 27B, 28B, 29B, 30B, 31B and 32B are top views showing processes for fabricating a semiconductor device according to a fourth preferred embodiment of the present invention.

As shown in FIGS. 26A and 26B, circuit elements 402 are formed on an upper surface 408 of a semiconductor substrate 401, which may be of GaAs (gallium arsenide). The circuit elements 402 are arranged so that a pair of them are opposing/facing to each other. In FIGS. 26A and 26B, although only four circuit elements 402 are shown, more circuit elements may be formed on the semiconductor substrate 401. The semiconductor substrate 401 is provided with a behind surface 410, on which no circuit element is formed.

Figure 27A:
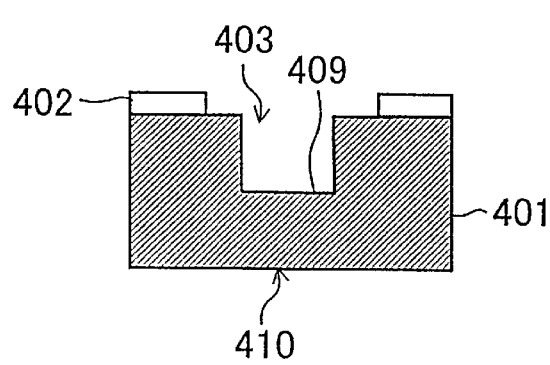
Figure 27B:
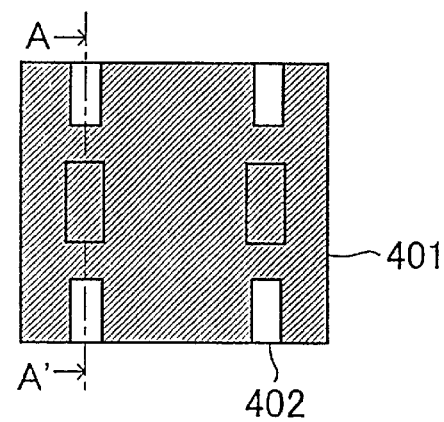

Next, as shown in FIGS. 27A and 27B, square shaped holes 403 are formed on the upper surface 408 of the semiconductor substrate 401 by an anisotropic etching process, so that the holes 403 have straight-down (vertical) side walls. Each of the holes 403 is arranged between the opposing two circuit elements 402. In this embodiment, although the holes 403 do not passes through the semiconductor substrate 401 to the behind surface 410, the holes 403 may be passing through it.

Figure 28A:
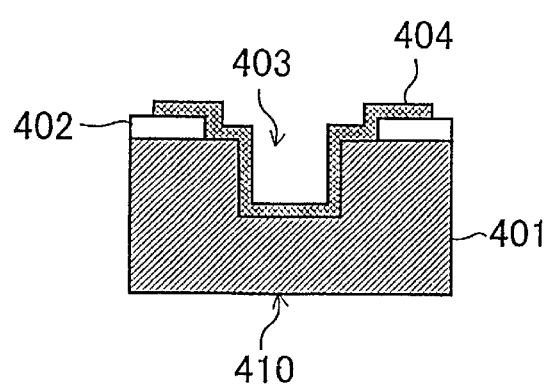
Figure 28B:
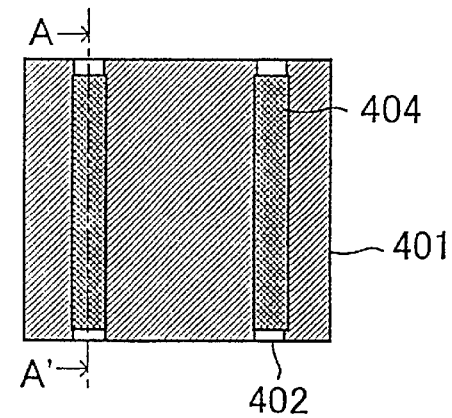

Then, as shown in FIGS. 28A and 28B, first conductive layers 404 are formed on an inside surface 409 of the holes 403. The first conductive layers 404 are provided to extend between the opposing two circuit elements 402 so that those circuit elements 402 are electrically connected to each other. The first conductive layers 404 may be of Al (aluminum) or Au (gold).

Figure 29A:
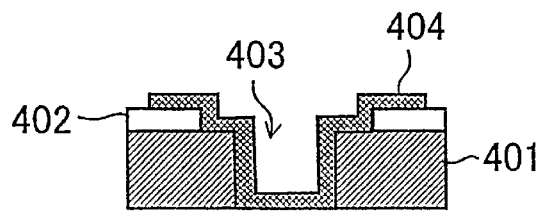
Figure 29B:
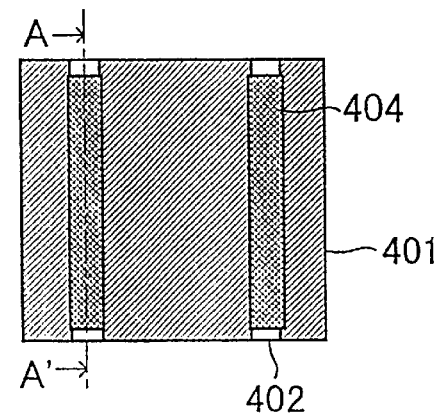
Figure 30A:
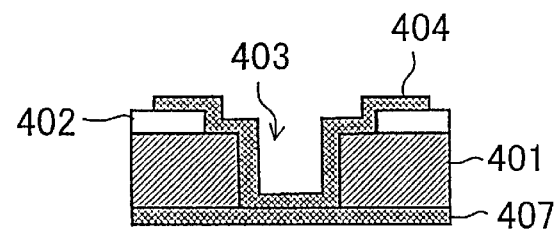
Figure 30B:
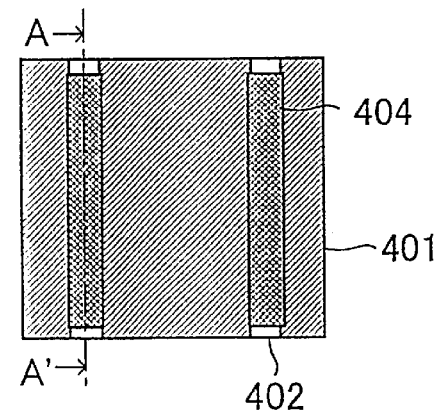

Subsequently, as shown in FIGS. 29A and 29B, the semiconductor substrate 401 is removed at the behind surface 410 until the first conductive layers 404 are exposed. The semiconductor substrate 401 may be polished using $Al_2O_3$ of abrasive. Then, as shown in FIGS. 30A and 30B, a second conductive layer 407 is provided at the bottom of the semiconductor substrate 401 so that the first and second conductive layers 404 and 407 are electrically connected to each other. The second conductive layer 407 may be of Ti (titanium), Pt (platinum) or Au (gold).

Figure 31A:
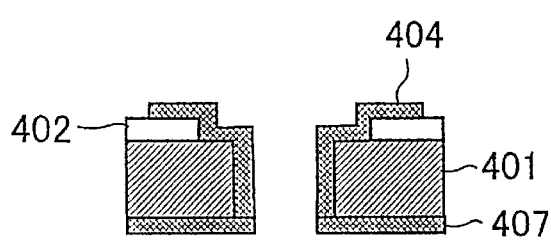
Figure 31B:
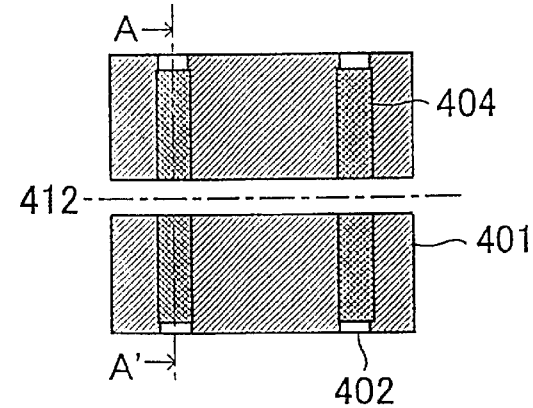
Figure 32A:
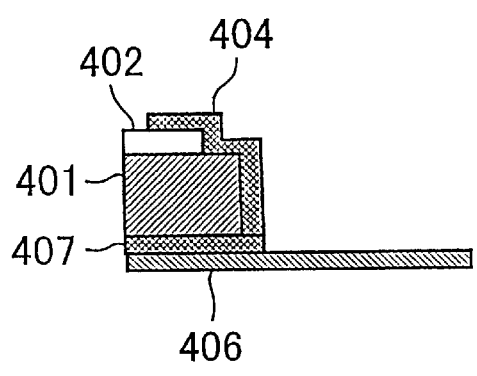
Figure 32B:
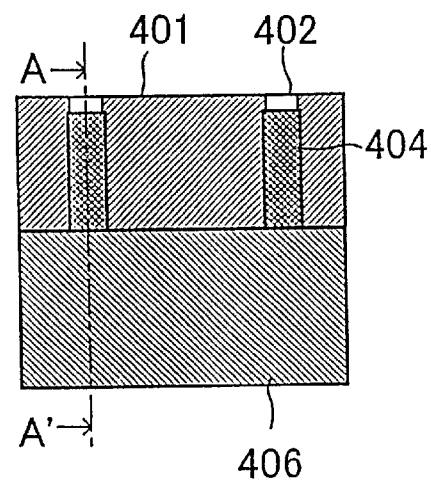

Next, as shown in FIGS. 31A and 31B, the semiconductor substrate 401 is cut/divided along a dicing line 412 to separate the opposing two circuit elements 402 from each other. Then, as shown in FIGS. 32A and 32B, the second conductive layer 407 of the divided semiconductor substrate 401 is connected/adhered to a lead frame 406 so that the circuit element 402 of each individual device is electrically connected to the lead frame 406 through the first and second conductive layers 404 and 407.

According to the fourth preferred embodiment of the present invention, the circuit element 402 of each semiconductor device is electrically connected to the lead frame 406 through the first and second conductive layers 404 and 407; therefore, no wire-bonding process is required. Further, the semiconductor substrate 401 is divided along the dicing line 412, which is running across the via-hole 403, so that no hole is left on each individual semiconductor device. As a result, an area for the circuit elements 402 can be designed to be larger, and it becomes easier to increase the degree of integration of the semiconductor device.

In addition, according to the fourth preferred embodiment, the hole 403 is formed by an anisotropic etching process, so that the upper opening area of the hole 403 can be reduced as compared to the first preferred embodiment, in which the hole is formed by an isotropic etching process.

(5) Fifth Preferred Embodiment

FIGS. 33A, 34A, 35A, 36A, 37A, 38A and 39A are cross-sectional views, respectively taken on line A–A' in FIGS. 33B, 34B, 35B, 36B, 37B, 38B and 39B. FIGS. 33B, 34B, 35B, 36B, 37B, 38B and 39B are top views showing processes for fabricating a semiconductor device according to a fifth preferred embodiment of the present invention.

Figure 33A:
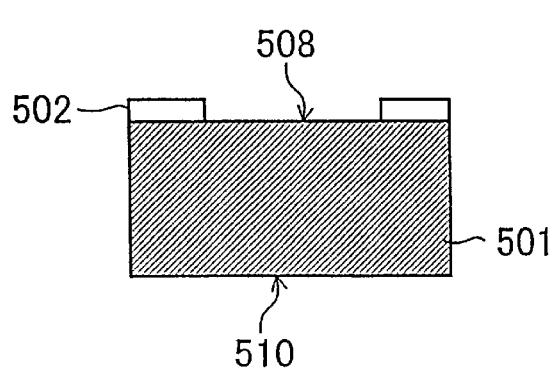
FIGS. 33A, 34A, 35A, 36A, 37A, 38A and 39A are cross-sectional views, respectively taken on line A–A' in FIGS. 33B, 34B, 35B, 36B, 37B, 38B and 39B.
Figure 33B:
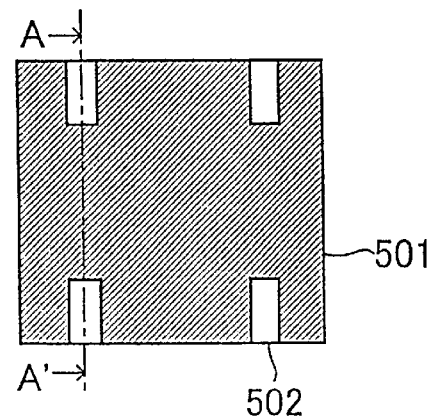
FIGS. 33B, 34B, 35B, 36B, 37B, 38B and 39B are top views showing processes for fabricating a semiconductor device according to a fifth preferred embodiment of the present invention.

As shown in FIGS. 33A and 33B, circuit elements 502 are formed on an upper surface 508 of a semiconductor substrate 501, which may be of GaAs (gallium arsenide). The circuit elements 502 are arranged so that a pair of them are opposing/facing to each other. In FIGS. 33A and 33B, although only four circuit elements 502 are shown, more circuit elements may be formed on the semiconductor substrate 501. The semiconductor substrate 501 is provided with a behind surface 510, on which no circuit element is formed.

Figure 34A:
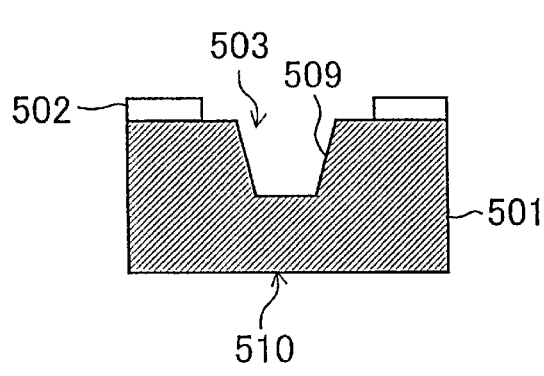
Figure 34B:
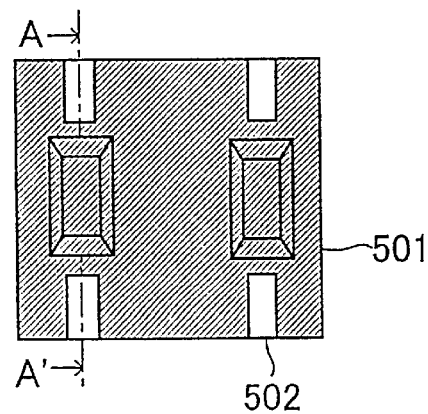

Next, as shown in FIGS. 34A and 34B, square shaped holes 503 are formed on the upper surface 508 of the semiconductor substrate 501 by an isotropic etching process. Each of the holes 503 is arranged between the opposing two circuit elements 502. In this embodiment, although the holes 503 do not passes through the semiconductor substrate 501 to the behind surface 510, the holes 503 may be passing through it.

Figure 35A:
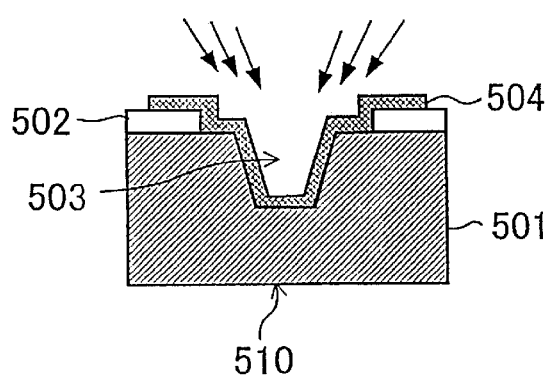
Figure 35B:
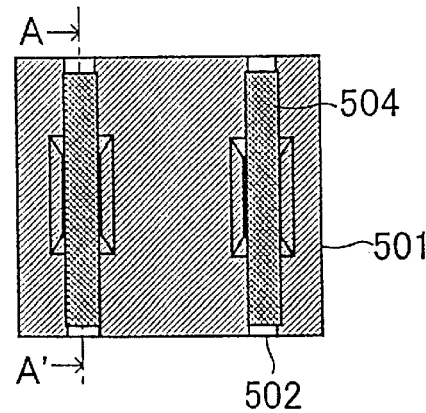

Then, as shown in FIGS. 35A and 35B, first conductive layers 504 are formed on an inside surface 509 of the holes 503 by a sputtering deposition process using electron beams, which are irradiated with a predetermined angle from the vertical line. The first conductive layers 504 are provided to extend between the opposing two circuit elements 502 so that those circuit elements 502 are electrically connected to each other. The first conductive layers 504 may be of Al (aluminum) or Au (gold).

Figure 36A:
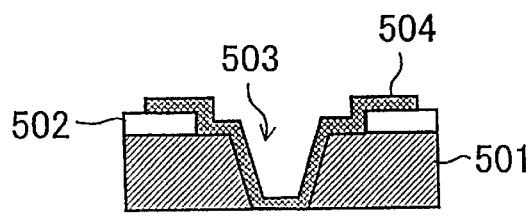
Figure 36B:
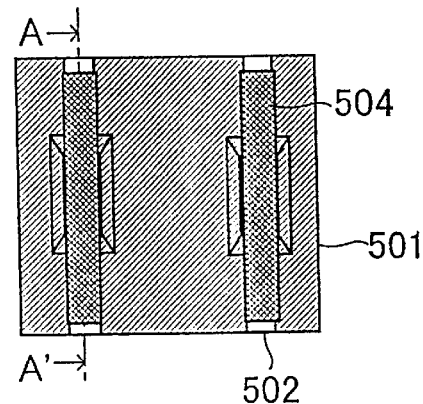
Figure 37A:
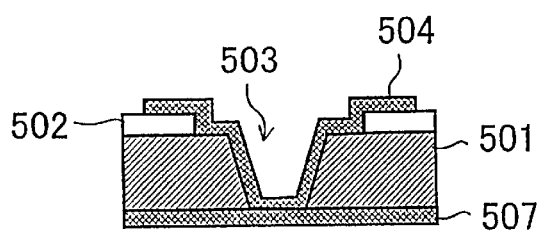
Figure 37B:
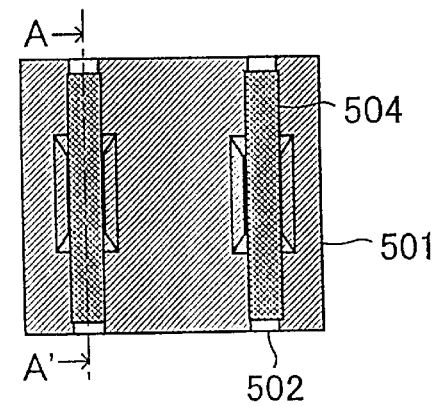

Subsequently, as shown in FIGS. 36A and 36B, the semiconductor substrate 501 is removed at the behind surface 510 until the first conductive layers 504 are exposed. The semiconductor substrate 501 may be polished using $Al_2O_3$ of abrasive. Then, as shown in FIGS. 37A and 37B, a second conductive layer 507 is provided at the behind surface of the semiconductor substrate 501 so that the first and second conductive layers 504 and 507 are electrically connected to each other. The second conductive layer 507 may be of Ti (titanium), Pt (platinum) or Au (gold).

Figure 38A:
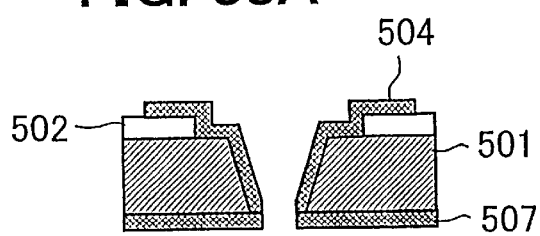
Figure 38B:
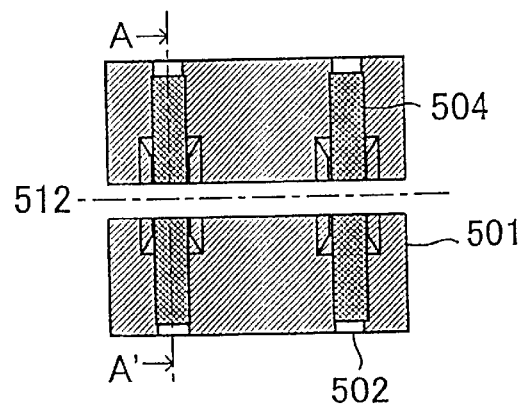
Figure 39A:
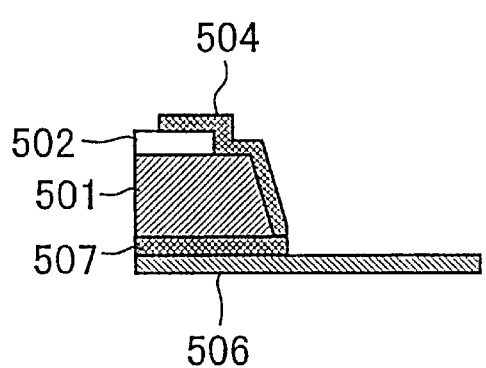
Figure 39B:
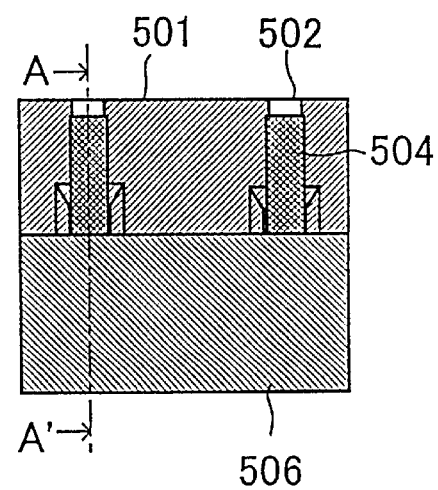

Next, as shown in FIGS. 38A and 38B, the semiconductor substrate 501 is cut/divided along a dicing line 512 to separate the opposing two circuit elements 502 from each other. Then, as shown in FIGS. 39A and 39B, the second conductive layer 507 of the divided semiconductor substrate 501 is connected/adhered to a lead frame 506 so that the circuit element 502 of each individual device is electrically connected to the lead frame 506 through the first and second conductive layers 504 and 507.

According to the fifth preferred embodiment of the present invention, the circuit element 502 of each semiconductor device is electrically connected to the lead frame 506 through the first and second conductive layers 504 and 507; therefore, no wire-bonding process is required. Further, the semiconductor substrate 501 is divided along the dicing line 512, which is running across the via-holes 503, so that no hole is left on each individual semiconductor device. As a result, an area for the circuit elements 502 can be designed to be larger, and it becomes easier to increase the degree of integration of the semiconductor device.

In addition, according to the fifth preferred embodiment, the first conductive layer 504 is formed by a sputtering deposition process using electron beams, so that the first conductive layer 504 can be formed reliably, even if the inside wall 509 of the holes 503 are shaped to be almost vertical to the semiconductor substrate 501.

(6) Sixth Preferred Embodiment

FIGS. 40A, 41A, 42A, 43A, 44A and 45A are cross-sectional views, respectively taken on line A–A' in FIGS. 40B, 41B, 42B, 43B, 44B and 45B. FIGS. 40B, 41B, 42B, 43B, 44B and 45B are top views showing processes for fabricating a semiconductor device according to a sixth preferred embodiment of the present invention.

Figure 40A:
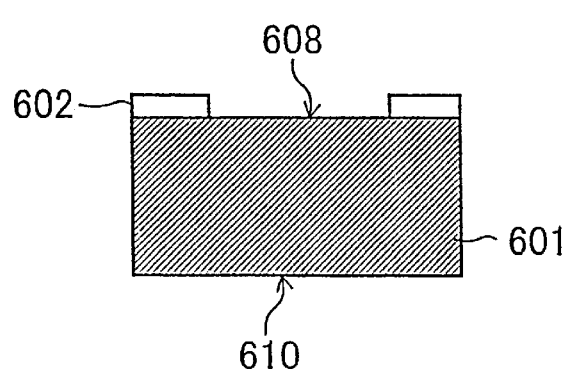
FIGS. 40A, 41A, 42A, 43A, 44A and 45A are cross-sectional views, respectively taken on line A–A' in FIGS. 40B, 41B, 42B, 43B, 44B and 45B.
Figure 40B:
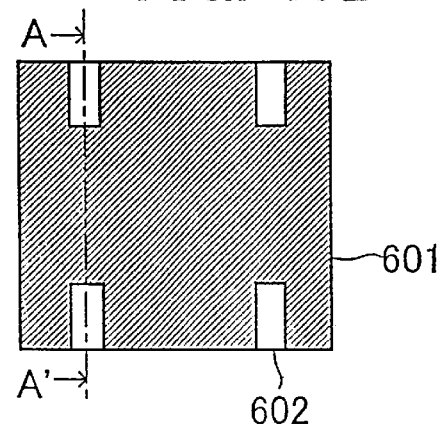
FIGS. 40B, 41B, 42B, 43B, 44B and 45B are top views showing processes for fabricating a semiconductor device according to a sixth preferred embodiment of the present invention.

First, as shown in FIGS. 40A and 40B, circuit elements 602 are formed on an upper surface 608 of a semiconductor substrate 601, which may be of GaAs (gallium arsenide). The circuit elements 602 are arranged so that a pair of them are opposing/facing to each other. In FIGS. 40A and 40B, although only four circuit elements 602 are shown, more circuit elements may be formed on the semiconductor substrate 601. The semiconductor substrate 601 is provided with a behind surface 610, on which no circuit element is formed.

Figure 41A:
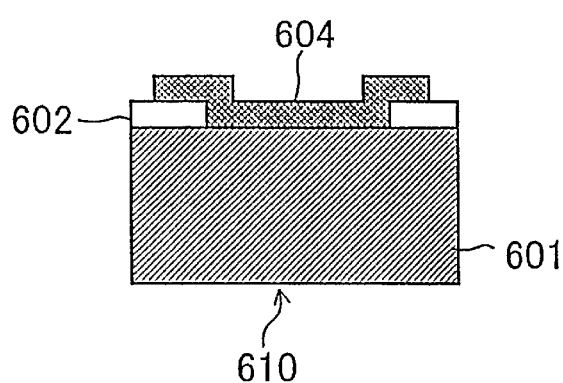
Figure 41B:
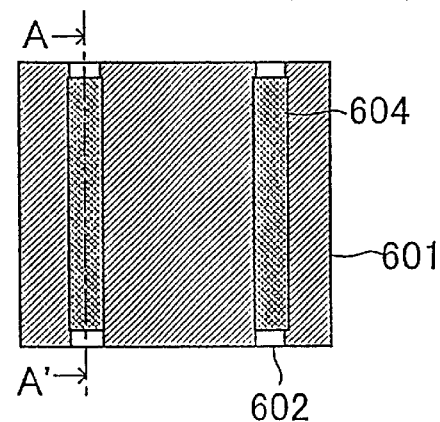
Figure 42A:
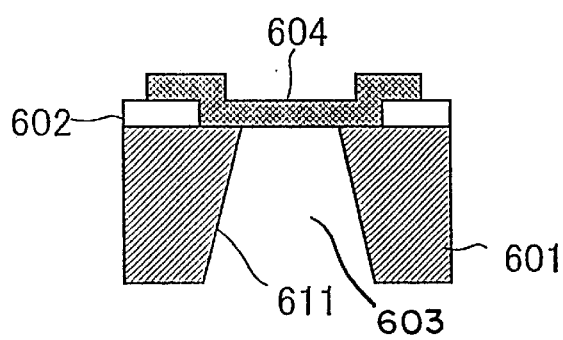
Figure 42B:
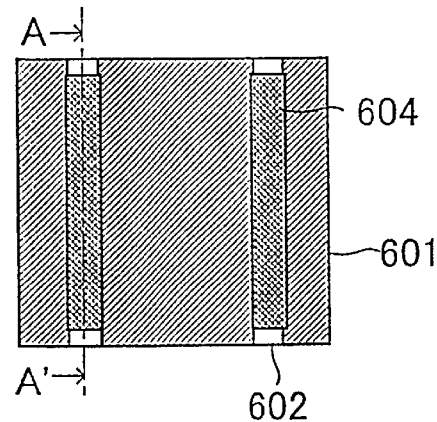

Next, as shown in FIGS. 41A and 41B, a first conductive layers 604 are formed on the surface 608 of the semiconductor substrate 601. The first conductive layers 604 extend between the opposing two circuit elements 602 so that those circuit elements 602 are electrically connected to each other. The first conductive layers 604 may be of Al (aluminum) or Au (gold). Then, as shown in FIGS. 42A and 42B, a square shaped hole 603 is formed on the behind surface 610 of the semiconductor substrate 601 by an isotropic etching process, so that the first conductive layer 604 is exposed to the hole 603.

Figure 43A:
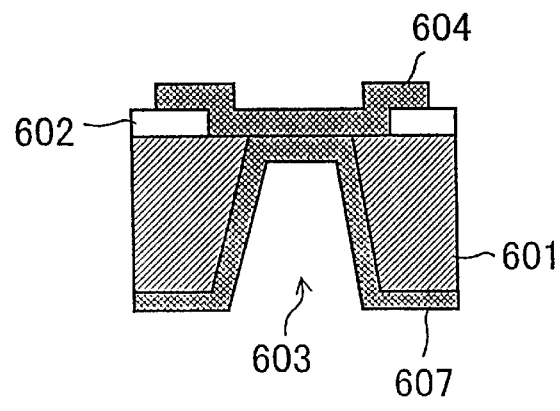
Figure 43B:
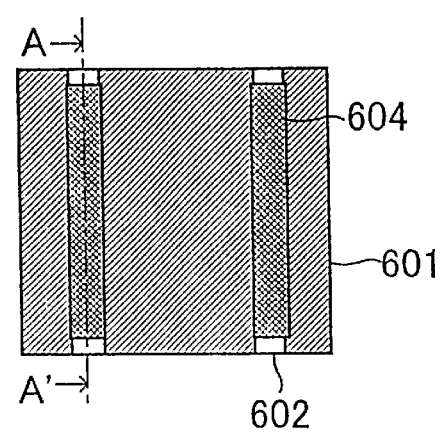

Subsequently, as shown in FIGS. 43A and 43B, a second conductive layer 607 is provided in the hole 603 so that the first and second conductive layers 604 and 607 are electrically connected to each other. The second conductive layer 607 may be of Ti (titanium), Pt (platinum) or Au (gold).

Figure 44A:
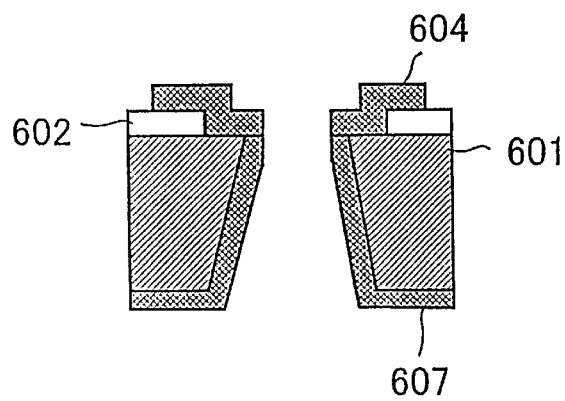
Figure 44B:
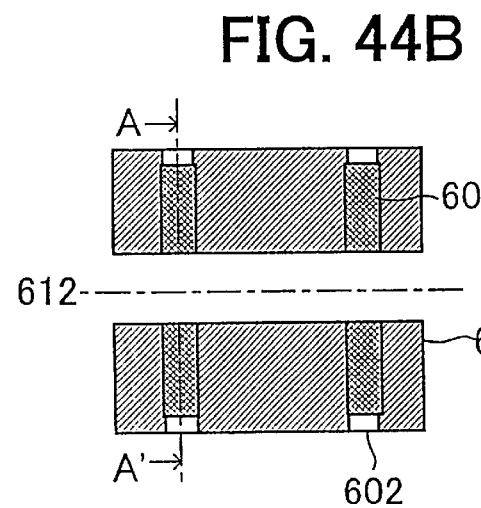
Figure 45A:
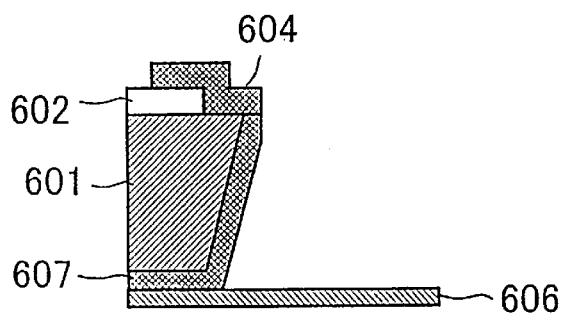
Figure 45B:
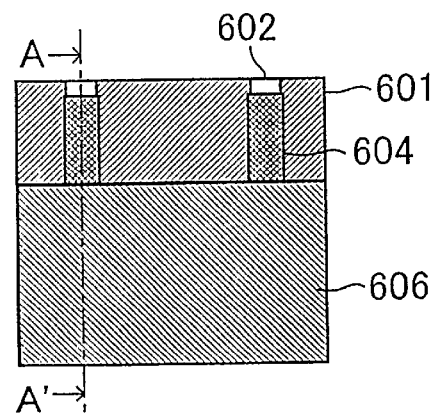

Next, as shown in FIGS. 44A and 44B, the semiconductor substrate 601 is cut/divided along a dicing line 612 to separate the opposing two circuit elements 602 from each other. The dicing line 612 is arranged along the hole 603. Then, as shown in FIGS. 45A and 45B, the second conductive layer 607 of the divided semiconductor substrate 601 is connected/adhered to a lead frame 606 so that the circuit element 602 of each individual device is electrically connected to the lead frame 606 through the first and second conductive layers 604 and 607.

According to the sixth preferred embodiment of the present invention, the circuit element 602 of each semiconductor device is electrically connected to the lead frame 606 through the first and second conductive layers 604 and 607; therefore, no wire-bonding process is required. Further, the semiconductor substrate 601 is divided along the dicing line 612, which is overlapped with the via-hole 603, so that no hole is left on each individual semiconductor device. As a result, an area for the circuit elements 602 can be designed to be larger, and it becomes easier to increase the degree of integration of the semiconductor device.

In addition, according to the sixth preferred embodiment, the hole 603 is formed on the behind surface 610 of the semiconductor substrate 601, so that a wider area for the circuit elements 602 can be obtained as compared to the other embodiments, in which the hole is formed on the upper surface of the semiconductor substrate.

What is claimed is:

1. A method for fabricating a semiconductor device, comprising the steps of:

providing a semiconductor substrate;

providing first and second circuit elements on a surface of the semiconductor substrate;

providing a hole in the semiconductor substrate between the first and second circuit elements; and dividing the semiconductor substrate at the hole to separate the first and second circuit elements from each other.

2. A method according to claim 1, wherein the hole is formed by an isotropic etching process.

3. A method according to claim 1, wherein the hole is formed by an anisotropic etching process.

4. A method according to claim 1, wherein the hole extends in a direction that is parallel to a direction in which the semiconductor substrate is divided.

5. A method according to claim 1, further comprising the step of:

providing a first conductive layer in the hole so that the first conductive layer is connected to the first and second circuit elements.

6. A method according to claim 5, wherein the first conductive layer is formed in the hole by a sputtering process using electron beams, which are irradiated with a predetermined angle from a vertical direction.

7. A method according to claim 5, further comprising the steps of:

removing an other surface of the semiconductor substrate until the first conductive layer is exposed, but whereby the hole does not pass through the semiconductor substrate; and providing a second conductive layer on the removed surface of the semiconductor substrate so that the second conductive layer is connected to the first conductive layer.

8. A method according to claim 7, further comprising the step of:

connecting the second conductive layer to a lead frame so that each of the first and second circuit elements is electrically connected to the lead frame.

9. A method according to claim 7, wherein the other surface of the semiconductor substrate is polished to expose the first conductive layer.

10. A method according to claim 5, wherein said dividing comprises removing an other surface of the semiconductor substrate until the first conductive layer is exposed and the hole passes through the semiconductor substrate to separate the first and second circuit elements from each other, the method further comprising providing a second conductive layer on the removed surface of the semiconductor substrate so that the second conductive layer is connected to the first conductive layer.

11. A method according to claim 10, further comprising the step of:

electrically connecting the second conductive layer to a lead frame so that each of the first and second circuit elements is connected to the lead frame.

12. A method according to claim 10, wherein the other surface of the semiconductor substrate is polished so that the hole passes through the semiconductor substrate.

13. A method for fabricating a semiconductor device, comprising the steps of:

providing a semiconductor substrate;

providing first and second circuit elements on a surface of the semiconductor substrate;

forming a hole on the surface of the semiconductor substrate between the first and second circuit elements, the hole not passing through the semiconductor substrate;

providing a first conductive layer in the hole so that the first conductive layer is connected to the first and second circuit elements;

removing an other surface of the semiconductor substrate until the first conductive layer is exposed, but whereby the hole does not pass through the semiconductor substrate;

providing a second conductive layer on the removed surface of the semiconductor substrate so that the second conductive layer is connected to the first conductive layer;

cutting the semiconductor substrate at the hole so that the first and second circuit elements are separated from each other; and connecting the second conductive layer to a lead frame so that each of the first and second circuit elements is electrically connected to the lead frame.

14. A method for fabricating a semiconductor device, comprising the steps of:

providing a semiconductor substrate;

providing first and second circuit elements on a surface of the semiconductor substrate;

forming a hole on the surface of the semiconductor substrate between the first and second circuit elements, the hole not passing through the semiconductor substrate;

providing a first conductive layer in the hole so that the first conductive layer is connected to the first and second circuit elements;

removing an other surface of the semiconductor substrate until the first conductive layer is exposed and the hole passes completely through the semiconductor substrate to separate the first and second circuit elements from each other;

providing a second conductive layer on the removed surface of the semiconductor substrate so that the second conductive layer is connected to the first conductive layer; and connecting the second conductive layer to a lead frame so that each of the first and second circuit elements is electrically connected to the lead frame.

15. A method according to claim 5, wherein said dividing comprises cutting the semiconductor substrate at the hole to separate the first and second circuit elements from each other, the method further comprising:

providing a lead frame; and connecting the first conductive layer and the lead frame with a conductive adhesive so that the first and second circuit elements are electrically connected to the lead frame.

16. A method according to claim 1, wherein the hole is formed on an other surface of the semiconductor substrate on which no circuit element is provided.

17. A method according to claim 16, further comprising the step of:

before forming the hole, providing a first conductive layer on the surface of the semiconductor substrate so that the first conductive layer is connected to the first and second circuit elements, wherein the first conductive layer is exposed when the hole is formed.

18. A method according to claim 17, further comprising the step of:

providing a second conductive layer in the hole so that the first conductive layer and the second conductive layer are connected to each other, said dividing comprising cutting the semiconductor substrate at the hole to separate the first and second circuit elements from each other.

19. A method for fabricating a semiconductor device, comprising the steps of:

providing a semiconductor substrate;

providing first and second circuit elements on a surface of the semiconductor substrate;

providing a first conductive layer on the surface of the semiconductor substrate so that the first conductive layer is connected to the first and second circuit elements;

forming a hole on an other surface of the semiconductor substrate on which no circuit element is provided, between the first and second circuit elements so that the first conductive layer is exposed to the hole;

providing a second conductive layer in the hole so that the first conductive layer and the second conductive layer are connected to each other;

cutting the semiconductor substrate at the hole to separate the first and second circuit elements from each other; and connecting the second conductive layer to a lead frame so that each of the first and second circuit elements is electrically connected to the lead frame.

20. A semiconductors device fabricated by a method comprising the steps of:

providing a semiconductor substrate;

providing first and second circuit elements on a surface of the semiconductor substrate;

providing a hole in the semiconductor substrate between the first and second circuit elements; and dividing the semiconductor substrate at the hole to separate the first and second circuit elements from each other.

21. A method according to claim 1, wherein said dividing comprises cutting through the hole.

22. A method of fabricating a semiconductor device, comprising:

forming first and second circuit elements on a surface of a semiconductor substrate;

forming a hole in the semiconductor substrate;

forming a conductive layer on the semiconductor substrate so as to extend from a top surface of the first circuit element and a top surface of the second circuit element to an interior surface of the hole;

removing an other surface of the semiconductor substrate so as to expose the conductive layer from the other surface of the semiconductor substrate; and dividing the semiconductor substrate at the hole to separate the first circuit element and the second circuit element, whereby the exposed conductive layer is divided.

23. A method of fabricating a semiconductor device, comprising:

forming first and second circuit elements on a surface of a semiconductor substrate;

forming a hole in the semiconductor substrate, the hole having a side wall and bottom surface;

forming a conductive layer on the semiconductor substrate so as to extend from a top surface of the first circuit element and a top surface of the second circuit element to the side wall of the hole; and dividing the semiconductor substrate along the bottom surface of the hole to separate the first circuit element and the second circuit element, whereby the conductive layer remains in the side wall of the hole.

24. A method of fabricating a semiconductor device, comprising:

forming first and second circuit elements on a surface of a semiconductor substrate;

forming a hole in the semiconductor substrate between the first and second circuit elements, wherein the hole extends from one end of the semiconductor substrate to an other end of the semiconductor substrate;

forming a first conductive layer on the semiconductor substrate so as to extend from a top surface of the first circuit element and a top surface of the second circuit element to an interior surface of the hole; and removing an other surface of the semiconductor substrate so as to expose the first conductive layer from the other surface of the semiconductor substrate.

* * * * *